United States Patent
Shonai

(10) Patent No.: US 12,084,789 B2
(45) Date of Patent: Sep. 10, 2024

(54) 8-INCH N-TYPE SIC SINGLE CRYSTAL SUBSTRATE

(71) Applicant: Resonac Corporation, Tokyo (JP)

(72) Inventor: Tomohiro Shonai, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/203,254

(22) Filed: May 30, 2023

(65) Prior Publication Data

US 2023/0392287 A1 Dec. 7, 2023

(30) Foreign Application Priority Data

Jun. 2, 2022 (JP) ................................. 2022-090469

(51) Int. Cl.
*C30B 29/36* (2006.01)

(52) U.S. Cl.
CPC .................................. *C30B 29/36* (2013.01)

(58) Field of Classification Search
None
See application file for complete search history.

(56) References Cited

U.S. PATENT DOCUMENTS

| | | | |
|---|---|---|---|
| 2017/0321345 A1 | 11/2017 | Xu et al. | |
| 2020/0071847 A1 | 3/2020 | Vogel et al. | |

FOREIGN PATENT DOCUMENTS

| | | |
|---|---|---|
| CN | 102569055 A | 7/2012 |
| CN | 106012002 A | 10/2016 |
| CN | 109321980 A | 2/2019 |
| CN | 109702639 A | 5/2019 |
| CN | 110408988 A | 11/2019 |
| CN | 110872731 A | 3/2020 |
| CN | 112430845 A | 3/2021 |
| CN | 112809458 A | 5/2021 |
| CN | 113026093 A | 6/2021 |
| CN | 114496724 A | 5/2022 |
| EP | 3 666 937 A1 | 6/2020 |
| JP | 2017-065986 A | 4/2017 |
| JP | 2019-189499 A | 10/2019 |
| JP | 6594146 B2 | 10/2019 |
| JP | 6598150 B2 | 10/2019 |
| JP | 2020-017627 A | 1/2020 |
| JP | 2020-511390 A | 4/2020 |
| WO | 2016/051975 A1 | 4/2016 |
| WO | 2016/113924 A1 | 7/2016 |
| WO | 2021/025077 A1 | 2/2021 |
| WO | 2021/133626 A1 | 7/2021 |

OTHER PUBLICATIONS

Ohtani et al.; Novel characterization method for the nitrogen doping concentration in heavily nitrogen-doped 4H-SiC crystals by Raman scattering microscopy; Jpn. J. Appl. Phys. 59 051003; 2020.*

* cited by examiner

*Primary Examiner* — Guinever S Gregorio
(74) *Attorney, Agent, or Firm* — Sughrue Mion, PLLC

(57) ABSTRACT

An 8 inch n-type SiC single crystal substrate of an embodiment has a diameter in the range of 195 to 205 mm, a thickness in the range of 300 μm to 650 μm, thicknesses of work-affected layers on both the front and back sides are 0.1 nm or less, and the dopant concentration is $2 \times 10^{18}/cm^3$ or more and $6 \times 10^{19}/cm^3$ or less at least five arbitrarily selected points in the plane within 5% of the thickness of the substrate in the depth direction from the main surface of the substrate.

8 Claims, 10 Drawing Sheets

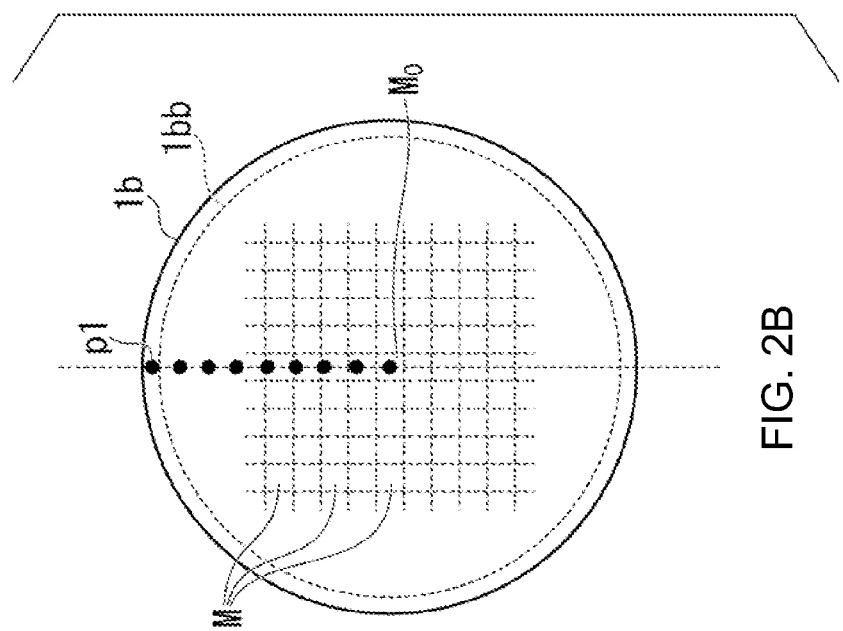
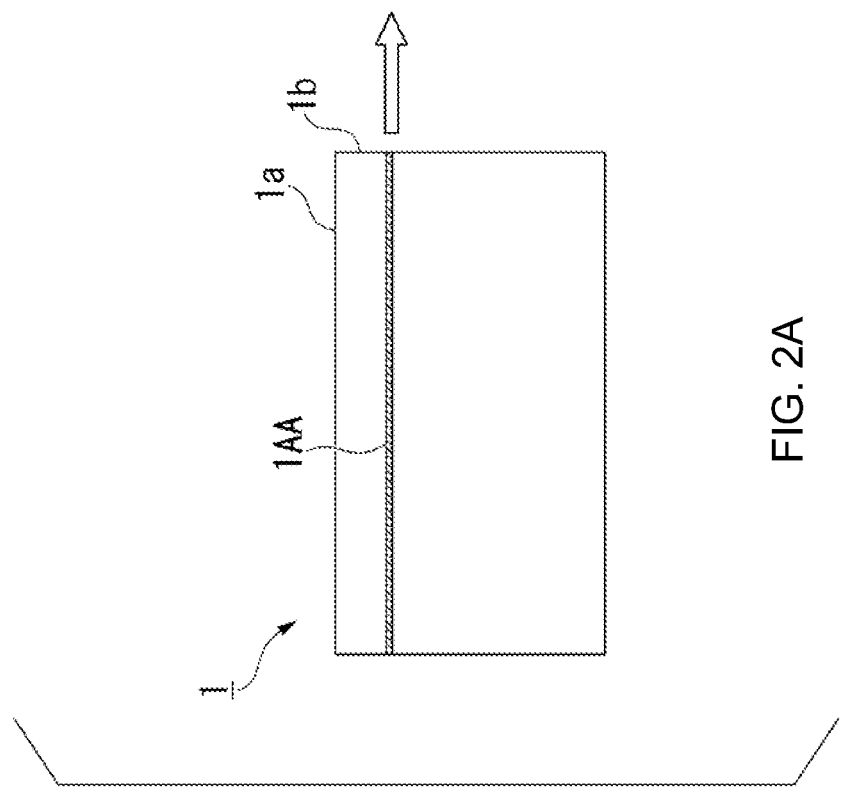
FIG. 2B
FIG. 2A

8-INCH N-TYPE SIC SINGLE CRYSTAL SUBSTRATE

BACKGROUND OF THE INVENTION

Field of the Invention

The present disclosure relates to an 8-inch n-type SiC single crystal substrate.

Priority is claimed on Japanese Patent Application No. 2022-090469, filed on Jun. 2, 2022, the content of which is incorporated herein by reference.

Description of Related Art

Silicon carbide (SiC) has a breakdown electric field larger by one digit than and the band gap three times larger than those of silicon (Si). Moreover, silicon carbide (SiC) has characteristics such as thermal conductivity being about three times higher than silicon (Si). Silicon carbide (SiC) is expected to be applied to power devices, high frequency devices, high temperature operation devices, and the like. For such SiC devices, a SiC epitaxial wafer is used recently.

SiC epitaxial wafers are obtained by laminating a SiC epitaxial layer on the surface of a SiC single crystal substrate. Hereafter, the substrate before the lamination of the SiC epitaxial layer is referred to as a SiC single crystal substrate, and the substrate after the lamination of the SiC epitaxial layer is referred to as a SiC epitaxial wafer. SiC single crystal substrates are cut from a SiC single crystal ingot.

The mainstream of the current market for SiC single crystal substrates is SiC single crystal substrates with a diameter of 6 inches (150 mm), but the development for mass production of SiC single crystal substrates with a diameter of 8 inches (200 mm) is progressing, and full-scale mass production is beginning. Increasing production efficiency and reducing costs by increasing the diameter from 6 inch to 8 inch is expected to further popularize SiC power devices as the most effective means in energy-saving technologies.

In manufacturing the next generation of large-diameter SiC single crystal substrates, the same quality cannot be obtained by applying the manufacturing conditions optimized for the manufacture of SiC single crystal substrates with current size. This is because new problems arise with each new size. For example, Patent Literature 1 describes a problem that when a manufacturing technique of a 4-inch SiC single crystal substrate is applied to the manufacture of a 6-inch SiC single crystal substrate, thermal decomposition frequently occurs around the outer peripheral portion of the seed crystal, which causes macro defects, and therefore, single crystals with high crystal quality are not obtained with good yield. Patent Literature 1 describes an invention that solves the problem by using seed crystals of a given thickness. In this way, it is necessary to establish the manufacturing conditions for SiC single crystal substrates with new sizes while solving new problems that have arisen in response to new sizes.

In SiC devices as power semiconductors, it is very important to reduce the resistance by increasing the dopant concentration to reduce the loss. In addition, in order to reduce the variation in characteristics between devices of SiC devices, it is necessary to reduce the variation in dopant concentration as much as possible.

CITATION LIST

Patent Literature

Patent Literature 1: Japanese Examined Patent, No. 6594146
Patent Literature 2: Japanese Examined Patent, No. 6598150
Patent Literature 3: Japanese Unexamined Patent Application, First Publication No. 2020-17627
Patent Literature 4: Japanese Unexamined Patent Application, First Publication No. 2019-189499

The SiC single crystal substrate is obtained through the SiC single crystal ingot fabrication process and the SiC single crystal substrate fabrication process to fabricate the SiC single crystal substrate from the SiC single crystal ingot. To establish manufacturing technology for 8-inch SiC single crystal substrates, it is necessary to solve new problems specific to 8-inch substrates in each of the SiC single crystal ingot fabrication process and the SiC single crystal substrate fabrication process.

New problems specific to 8-inch substrates include, for example, obtaining an 8-inch substrate with the same dislocation density as that of a 6-inch substrate in the SiC single-crystal ingot fabrication process. When an 8-inch substrate is manufactured simply by applying a SiC single crystal substrate fabrication technique optimized for the manufacture of 6-inch substrates, an 8-inch substrate with a dislocation density higher than that of a 6-inch substrate is produced. The larger the size, the greater the hurdle to get the same quality. Therefore, when evaluating the technical significance of the manufacturing technique of 8-inch SiC single crystal substrates, the dislocation density of 8-inch substrates obtained by simply applying the manufacturing technique of SiC single crystal substrates optimized for the manufacture of 6-inch substrates is the starting point, and the technical significance should be evaluated by how much the dislocation density of the starting point has been improved on the basis of the dislocation density of the starting point.

On the other hand, the yield of 8-inch SiC single crystal substrates in mass production is determined by the same or more stringent evaluation criteria as 6-inch SiC single crystal substrates. Each step of improvement leads to the establishment of manufacturing technology for 8-inch SiC single crystal substrates.

In addition, in order to meet the growing demand for power semiconductors, it is essential to establish technologies for manufacturing 8-inch SiC single crystal substrates and for controlling variations in the dopant concentration distribution at high dopant concentration.

In view of the above circumstances, the present disclosure has been made to provide an 8-inch n-type SiC single crystal substrate having a high dopant concentration and suppressed concentration variations.

SUMMARY OF THE INVENTION

The present disclosure provides the following means to solve the above problems.

A first aspect of the present invention is an 8-inch n-type SiC single crystal substrate, wherein the diameter is in a range of 195 mm to 205 mm, the thickness is in a range of 300 μm to 650 μm, the thicknesses of work-affected layers on both the front and back surfaces are 0.1 nm or less, and the dopant concentration is $2 \times 10^{18}/cm^3$ or more and $6 \times 10^{19}/cm^3$ or less at least five arbitrarily selected points in the plane within 5% of the thickness of the substrate in the depth direction from the main surface of the substrate.

A second aspect of the present disclosure is, in the first aspect of 8-inch n-type SiC single crystal substrate, the dopant concentration at least five points in the radial direction, including a point within 1 mm from the outermost periphery, are within +/−20%, with respect to the dopant concentration at the in-plane center at the same depth from the main surface.

A third aspect of the present disclosure is an 8-inch n-type SiC single crystal substrate, wherein the diameter is in a range of 195 mm to 205 mm, the thickness is in a range of 300 μm to 650 μm, the thicknesses of work-affected layers on both the front and back surfaces are 0.1 nm or less, the dopant concentration is $2\times10^{18}/cm^3$ or more and $6\times10^{19}/cm^3$ or less, and when the plane at the same depth from the main surface is divided into 10 mm square meshes and the dopant concentration at any point in each mesh is taken as the dopant concentration of the mesh, the percentage of the mesh whose dopant concentration is within +/−20% of the dopant concentration of the mesh containing the in-plane center is 80% or more.

A fourth aspect of the present disclosure is an 8-inch n-type SiC single crystal substrate, wherein the diameter is in a range of 195 mm to 205 mm, the thickness is in a range of 300 μm to 650 μm, the thicknesses of work-affected layers on both the front and back surfaces are 0.1 nm or less, the dopant concentration is $2\times10^{18}/cm^3$ or more and $6\times10^{19}/cm^3$ or less, and the in-plane variation of the thickness of the substrate, which is the difference between the maximum and minimum substrate thickness at the center of the substrate and four points on the circumference of a circle having a radius half the radius of the substrate, is 2.0 μm or less.

A fifth aspect of the present disclosure is, in the fourth aspect of 8-inch n-type SiC single crystal substrate, wherein the in-plane variation of the thickness of the substrate is 1.5 μm or less A sixth aspect of the present disclosure is, in the fourth aspect of 8-inch n-type SiC single crystal substrate, wherein the in-plane variation of the thickness of the substrate is 1.0 μm or less The n-type SiC single crystal substrate of the present disclosure can provide an 8-inch SiC single crystal substrate with a high dopant concentration and suppressed concentration variations.

BRIEF DESCRIPTION OF THE DRAWINGS

FIG. 2A is a schematic cross-sectional view of a SiC single crystal substrate according to the present embodiment, and FIG. 2B is a schematic plan view.

DETAILED DESCRIPTION OF THE INVENTION

Hereinafter, the present embodiment will be described in detail with reference to the drawings. The drawings used in the following description may show, for convenience's sake, the features of the present disclosure in enlarged form, and the dimensional proportions of the components may be different from those in practice. The materials, dimensions, and the like exemplified in the following description are only examples, and the present disclosure is not limited thereto, and the disclosure can be carried out by appropriately changing the gist thereof without changing it. In addition, in each figure, components known to those skilled in the art other than those described in the figure may be omitted.

SiC Single Crystal Substrate

Figure 1B:
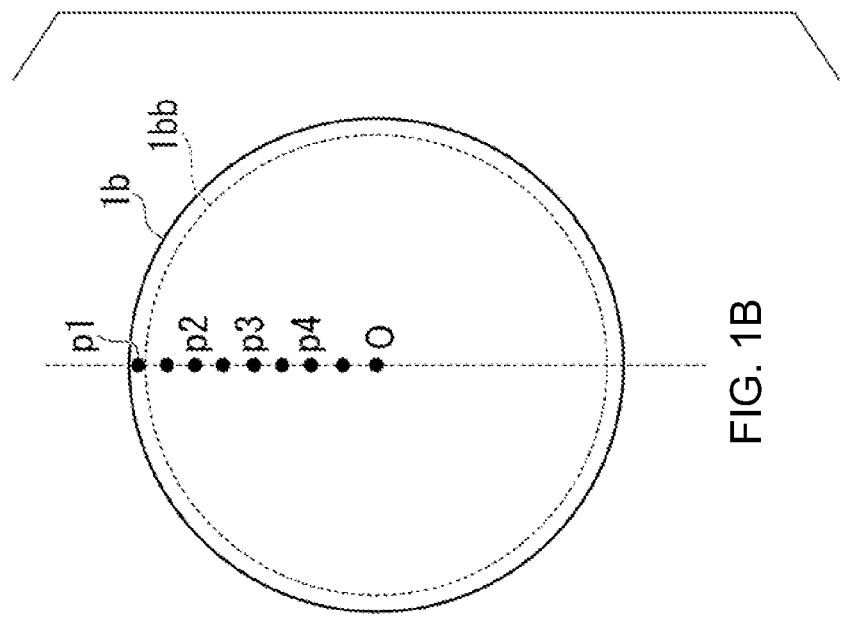
FIG. 1B is a schematic plan view.
Figure 1A:
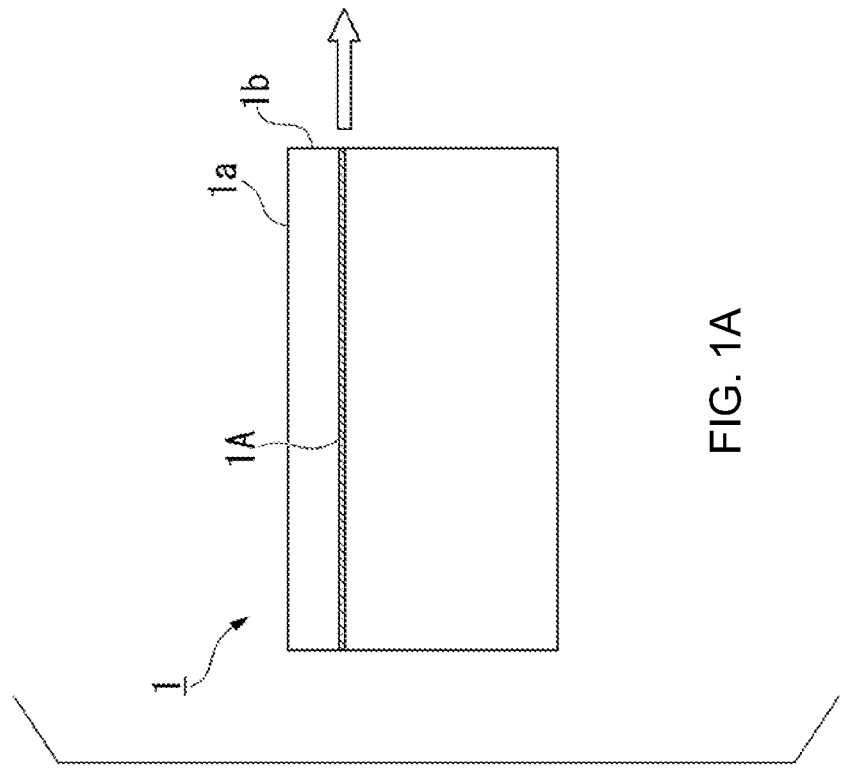
FIG. 1A is a schematic cross-sectional view of a SiC single crystal substrate according to the present embodiment.

FIG. 1A is a schematic cross-sectional view of a SiC single crystal substrate according to the present embodiment, and FIG. 1B is a schematic plan view.

The SiC single crystal substrate 1 shown in FIGS. 1A and 1B is an 8-inch n-type SiC single crystal substrate with a diameter in a range of 195 mm to 205 mm, a thickness in a range of 300 μm to 650 μm, thicknesses of work-affected layers on both the front and back surfaces are 0.1 nm or less, and a dopant concentration of $2\times10^{18}/cm^3$ or more and $6\times10^{19}/cm^3$ or less.

Although there are no particular restrictions on the outer shape of the SiC single crystal substrate 1, substrates with various flat shapes and various thicknesses can be used, but the substrate is typically disk-shaped. The thickness of the SiC single crystal substrate can be in the range of, for example, 300 μm to 650 μm.

SiC single crystal substrate 1 is preferably 4H—SiC. SiC comes in a variety of polytypes, because 4H—SiC is mainly used to make practical SiC devices.

One side of the SiC single crystal substrate 1 is the surface (the main surface) on which the SiC epitaxial layer is formed. It is preferable that the main surface is the c-plane (the (0001) plane of the 4H—SiC crystal) or a surface inclined at an inclination angle (off angle) greater than 0° and less than 10° with respect to c-plane. It is a 4H—SiC type single crystal wafer. The off-angle is preferably greater than 0° and less than 10° in the <11-20> direction of the c-plane.

Since the larger the off angle, the smaller the number of wafers obtained from the SiC single-crystal ingot, the smaller the off angle is preferable from the viewpoint of cost reduction. SiC single crystal substrates with an off-angle of, for example, 0.4° to 5° can be used. 0.4° can be said to be the lower limit as the off angle at which step-flow growth is possible.

Common nitrogen can be used as the n-type dopant, but it is not limited to nitrogen.

The dopant concentration of the SiC single crystal substrate 1 is $2 \times 10^{18}/cm^3$ or more and $6 \times 10^{19}/cm^3$ or less.

This is because the resistivity of the SiC single crystal substrate becomes too large when the dopant concentration of the SiC single crystal substrate is less than $2 \times 10^{18}/cm^3$, and because it becomes difficult to suppress stacking faults in the SiC single crystal substrate when the dopant concentration exceeds $6 \times 10^{19}/cm^3$. By keeping the dopant concentration of the SiC single crystal substrate in the range of $2 \times 10^{18}/cm^3$ or more and $6 \times 10^{19}/cm^3$ or less, the resistivity can be reduced while suppressing the stacking faults of the SiC single crystal substrate.

The magnitude of the dopant concentration can be adjusted by known methods. For example, the magnitude of dopant concentration can be adjusted by adjusting the amount of dopant gas introduced into the crucible (see symbol 10 in FIG. 5) during crystal growth by adjusting the introduction time, partial pressure, etc.

It is preferable that the dopant concentration is $2 \times 10^{18}/cm^3$ or more and $6 \times 10^{19}/cm^3$ or less at least five arbitrarily selected points in the plane 1A within 5% of the thickness of the substrate in the depth direction from the main surface 1a of the SiC single crystal substrate 1.

In FIGS. 1A and 1B, nine points, including the in-plane center O, are shown as measurement points of the dopant concentration in the plane 1A.

In the SiC single crystal substrate 1, with respect to the dopant concentration at the in-plane center at the same depth from the main surface 1a, the dopant concentration at least five points in the radial direction, including point p1 within 1 mm from the outermost periphery 1b, is preferably within +/-20%, more preferably within +/-15%, and even more preferably within +/-10%.

In FIGS. 1A and 1B, symbol 1bb indicates a circle whose circumstance is located at 1 mm from the outermost periphery 1b.

The in-plane distribution of the dopant concentration can be adjusted by known methods. For example, in order to make the dopant supply to the outer peripheral portion higher than the dopant supply to the inner peripheral portion, the dopant supply to the outer peripheral portion can be made higher than the dopant supply to the inner peripheral portion by providing a dopant gas passage in the crucible (see symbol 10 in FIG. 5) and adjusting the gas permeability of the crucible. For example, the amount of dopant supplied to the outer peripheral portion can be adjusted by providing an opening in the guide member (see symbol 20 in FIG. 5 and symbol 25 in FIG. 6) or adjusting the thickness of the guide member.

FIG. 2A is a schematic cross-sectional view of a SiC single crystal substrate according to the present embodiment, and FIG. 2B is a schematic plan view.

In the SiC single crystal substrate 1 shown in FIGS. 2A and 2B, when the plane 1AA at the same depth from the main surface 1a is divided into meshes M of 10 mm square and the dopant concentration at any point in each mesh is taken as the dopant concentration of the mesh, it is preferable that the percentage of the mesh whose dopant concentration is within +/-20% of the dopant concentration of the mesh M0 including the in-plane center is 80% or more.

The dopant concentration can be measured by secondary ion mass spectrometry (SIMS).

The thickness of the work-affected (work-altered) layers on both the front and back sides of the SiC single crystal substrate 1 is 0.1 nm or less.

The main surface (hereinafter, this surface may be referred to as the 'front surface'.) of the SiC single crystal substrate 1 is a mirror surface. This is because that it is necessary to form an epitaxial layer on the front surface of the SiC single crystal substrate by the epitaxial growth of SiC single crystal in order to fabricate various SiC devices. The mirror surface of the front surface is formed by mirror-finishing the surface of the cut substrate, which is obtained by cutting a part to be substrate from a SiC single crystal ingot manufactured using sublimation method or the like.

The other surface (hereafter, this surface may be referred to as the 'back surface'.) need not be a mirror surface, but in the case of a SiC single crystal substrate whose front surface is a mirror surface and whose back surface is not, a difference in residual stress occurs between the front surface and the back surface, and the substrate is warped to compensate for the residual stress (Twyman effect). By making the back surface also mirror surface, the warp of the substrate caused by the Twyman effect can be suppressed. A method has been developed to fabricate a SiC single crystal substrate with low warp, whose front surface is mirror-finished and whose back surface is not mirror-finished (see, e.g., Patent Literature 2.).

The SiC single crystal substrate 1 has a notch 2, which is a marker of the crystal orientation, but may have OF (orientation flat) instead of notch 2.

The SORI of the SiC single crystal substrate 1 is preferably 50 μm or less, more preferably 40 μm or less, more preferably 30 μm or less, and more preferably 20 μm or less.

Figure 3:
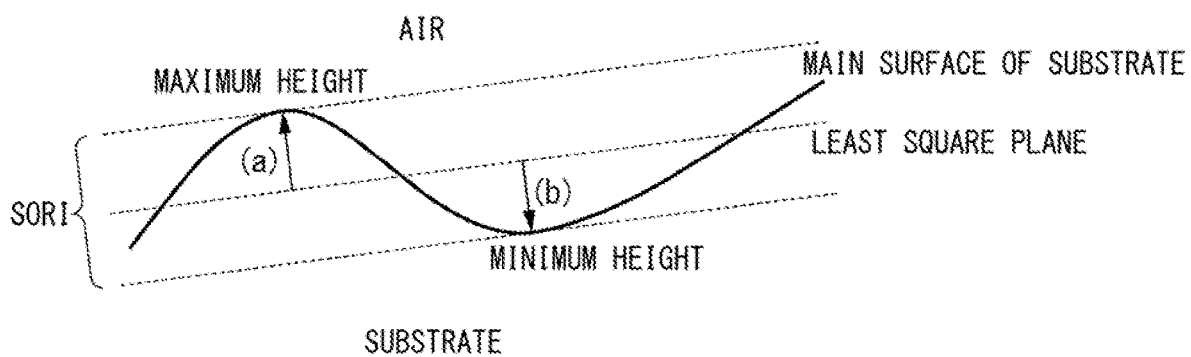
FIG. 3 is a conceptual diagram showing the definition of SORI.

SORI is one of the parameters that indicates the degree of warp of the substrate, and is expressed as the sum of the normal distances from the least square plane calculated by the least-squares method using all the data on the surface of the substrate to the highest and lowest points on the surface of the substrate when measured to support the back surface of the substrate without changing the original shape of the substrate. That is, when the least square plane of the substrate surface is taken as the reference height (least square plane height), as shown in FIG. 3, the figure shows the sum ((a)+(b)) of the distance (a) between the height at the highest point of the substrate surface and the reference height, and the distance (b) between the height at the lowest point and the reference height.

Relationship Between Work-Affected Layer and SORI

The SiC single crystal substrate is prepared by slicing SiC single-crystal ingot and flattening the surfaces. Such mechanical processing introduces distortion due to the mechanical processing into the surface of the substrate. The layer where the processing distortion occurs on the surface of a SiC single crystal substrate is called a work-affected (work-altered) layer as described above. When a work-affected layer is formed on the front and back surfaces, the difference in the processing distortion occurs on the front and back surfaces, and the difference also occurs in the residual stress, causing the warp of the substrate by the Twyman effect. The shape or the warp of the substrate is determined by the balance of stress conditions generated by the work-affected layers on both sides of the substrate.

Figure 4:
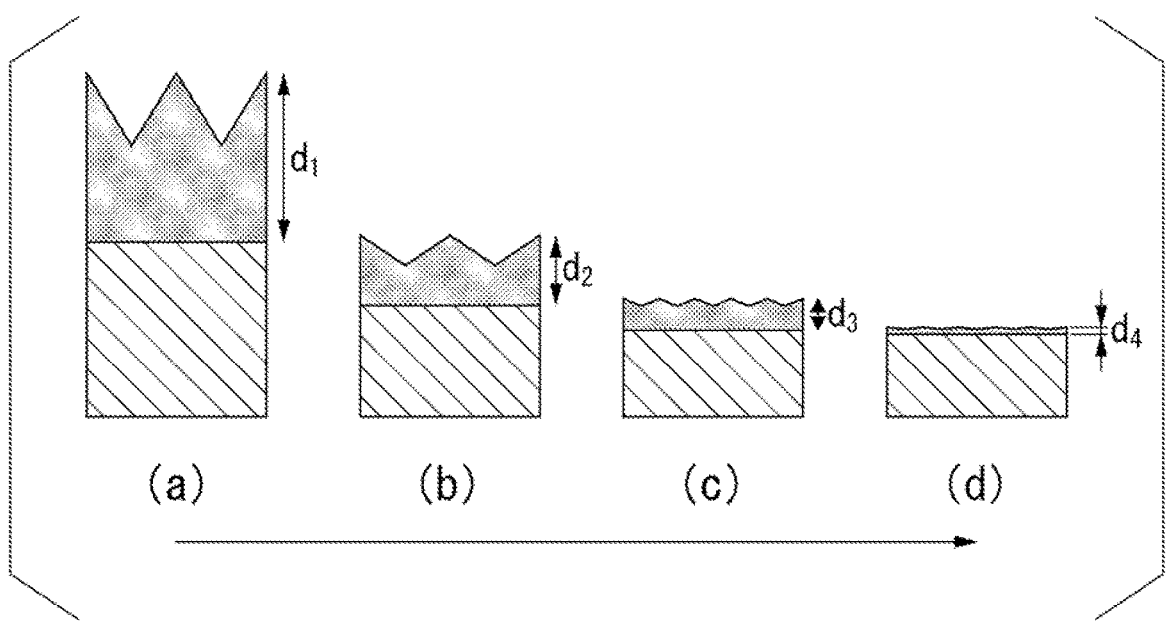
FIG. 4 is a conceptual diagram showing the process of reducing the work-affected layer depth by mechanical machining.

FIG. 4 is a conceptual diagram showing the process of reducing the depth d (d1, d2, d3, d4) of the work-affected layer by mechanical processing. For example, (a) of FIG. 4 is a conceptual cross-sectional view near the surface after lapping process, (b) of FIG. 4 is a conceptual cross-sectional view near the surface after polishing process, (c) of FIG. 4 is a conceptual cross-sectional view near the surface after finish-grinding, and (d) of FIG. 4 is a conceptual cross-sectional view near the surface after CMP.

FIG. 14 of Patent Literature 3 shows the relationship between the depth of the work-affected layer of a single-crystal SiC wafer and SORI. The graph shows that the deeper the work-affected layer, the larger the SORI value. Also, when comparing a 6-inch SiC single crystal substrate with a 4-inch SiC single crystal substrate, the 6-inch SiC single crystal substrate was more susceptible to the work-affected layer than the 4-inch SiC single crystal substrate, resulting in a larger SORI. Therefore, when comparing an 8-inch SiC single crystal substrate with a 6-inch SiC single crystal substrate, it is inferred that the 8-inch SiC single crystal substrate is more susceptible to the effect of the work-affected layer, resulting in a larger SORI. Therefore, it is more important to remove the work-affected layer to reduce the warp for the 8-inch SiC single crystal substrate than for the 6-inch SiC single crystal substrate.

The in-plane variation of the substrate thickness of the SiC single crystal substrate 1 is less than 2.0 µm. The in-plane variation of the thickness is preferably 1.5 µm or less, and more preferably 1.0 µm or less.

In the SiC single crystal substrate according to the present embodiment, reduction of in-plane variation in thickness is realized by performing lapping using a novel lapping slurry.

In this specification, "in-plane variation in substrate thickness" is expressed as the difference between the maximum and minimum values obtained of the thicknesses of a SiC single crystal substrate measured by a dial gauge or the like at five points (one center point and four points (positions of inscribed angle 0°, 90°, 180° and 270°) on the circumference of a circle having a radius half the radius of the substrate).

FIG. 14 in Patent Literature 3 shows the relationship between the depth of the work-affected layer, which is one parameter for the work-affected layer, and SORI. In developing an 8-inch SiC single crystal substrate with high yield, the inventor focused on in-plane variations in the depth of the remaining work-affected layer.

Even though the work-affected layer can be almost completely removed when the planarization process is carried out over a sufficiently long time at the laboratory level, it is assumed that the work-affected layer will remain somewhat when the planarization process is carried out in a practical time. In addition, although the depth d of the work-affected layer conceptually shown in FIG. 3 is drawn assuming an average depth, it is not exactly a uniform depth in reality, and it is assumed that a thin work-affected layer remains over the entire surface to have a slight variation in depth, or a work-affected layer remains locally on the surface. In such a case, it is inferred that the effect of the in-plane variation in the depth of the work-affected layer on SORI is greater in the case of an 8-inch SiC single crystal substrate than in the case of a 6-inch SiC single crystal substrate.

The in-plane variation in the substrate thickness of the SiC single crystal substrate 1 is considered to reflect the in-plane variation in the depth of the work-affected layer.

The density of micropipe defects in the SiC single crystal substrate 1 is preferably 1/cm² or less.

In the SiC single crystal substrate 1, the total number of etch pits appearing by KOH etching is preferably $5 \times 10^9$ or less, more preferably $5 \times 10^8$ or less, and even more preferably $5 \times 10^7$ or less. In this case, KOH etching was performed at 550° C. for 10 minutes.

The total number of etch pits corresponds to the total number of dislocations.

In the SiC single crystal substrate 1, the density of the etch pits identified as threading dislocations (TD) is preferably $2 \times 10^3/\text{cm}^2$ or less and the density of the etch pits identified as basal plane dislocations is preferably $5 \times 10^3/\text{cm}^2$ or less.

The density of etch pits identified as threading dislocations (TD) is more preferably $1 \times 10^3/\text{cm}^2$ or less, and even more preferably $5 \times 10^2/\text{cm}^2$ or less.

The density of etch pits identified as the basal plane dislocations is more preferably $2 \times 10^3$ pits/cm² or less, more preferably $1 \times 10^3$ pits/cm² or less, and more preferably $5 \times 2$ pits/cm² or less.

Here, threading dislocation is a combination of threading screw dislocation (TSD) and threading edge dislocation (TED).

The type of dislocation can be determined from the shape of the etch pits that appear by KOH etching using an optical microscope or the like, and the number of etch pits per unit area can be counted. In general, an etch pit with a medium hexagonal shape corresponds to a threading screw dislocation (TSD), an etch pit with a small hexagonal shape corresponds to a threading edge dislocation (TED), and an etch pit with an elliptical shape (shell shape) corresponds to a basal plane dislocation (BPD). In addition, an etch pit with a large hexagonal shape corresponds to a micropipe (MP).

Method of Manufacturing SiC Single Crystal Substrate

The method of manufacturing a SiC single crystal substrate according to the present embodiment is explained separately for the fabrication process of an n-type SiC single crystal ingot and the fabrication process of the SiC single crystal substrate from the ingot. The following is an example of the fabrication process of an n-type SiC single-crystal ingot in which nitrogen is introduced as a dopant.

Fabrication Process of n-type SiC Single Crystal Ingot

Continuing intense research, the inventor found that more precise control of temperature gradients in the radial and vertical directions (crystal growth direction) for a SiC single crystal ingot with 6-inch diameter was a key point in the fabrication of a SiC single crystal ingot with 8-inch diameter. It was found that more precise control of the temperature gradient in the radial and vertical directions (crystal growth direction) could be realized by applying the method disclosed in Patent Literature 4. Specifically, a SiC single crystal manufacturing apparatus with a heat-insulating member that can move along the extending direction of the guide member outside the guide member that guides crystal growth can be used. It is not limited to the method disclosed in Patent Literature 4 as a method for more precise control of temperature gradients in the radial and vertical directions (crystal growth direction).

In the transition to the large diameter SiC single crystal ingot, the application of the fabrication method of SiC single crystal ingots with conventional diameter does not yield large diameter SiC single crystal ingots with similar crystal quality. For example, the following problems occurred during the transition from a 4-inch diameter SiC single crystal ingot to a 6-inch diameter SiC single-crystal ingot (see Patent Literature 1).

In the growth of SiC single crystals by the sublimation recrystallization method using a seed crystal, it is necessary to make the surface shape of the ingot during growth to be nearly convex in the growth direction as one of the growth conditions to realize high crystal quality. This is because, for example, in the case of 4H-type SiC single crystals used in power devices, when growing roughly parallel to the <0001> axis, i.e., the c-axis direction of the crystal, the SiC single crystal grows by the evolution of spiral steps extruded from the threading screw dislocations. Therefore, it is said that by being generally convex, there is essentially a single step supply source on the growth surface to being able to improve the polytype stability. If the growth surface has a concave surface or multiple convex parts, there will be multiple sources supplying growth steps and steps delivered from different sources will collide. In such a case, not only defects such as dislocations are generated from the parts where they collide, but also the state of atomic stacking in the c-axis direction, which is unique to the 4H-type polytypes, becomes easily disturbed, so that different kinds of polytypes with different stacking structures, such as the 6H-type and the 15R-type are generated and micropipe defects are generated.

Therefore, for example, in order to stabilize a 4H-type polytype suitable for power devices and grow a so-called single polytype crystal composed of only 4H-type polytype, it is important to make the growth surface shape of the grown crystal roughly convex. Specifically, the convex shape of the grown crystal is realized by optimizing the temperature at the center of the grown crystal in terms of the growth rate, etc., and by controlling the temperature distribution during growth, that is, the shape of the isotherm, so that it becomes roughly convex. It was thought that the SiC single-crystal ingot grown under such growth conditions where the roughly convex isotherm was realized would grow to be approximately parallel to the isotherm, thereby ensuring the above polytype stability.

However, when the diameter of a growing crystal is more than 150 mm (6 inches), if the temperature at the center of the growing crystal is optimized to be equivalent to that of a conventional single crystal growth of 100 mm (4 inches) in terms of growth rate, etc., while controlling the temperature gradient during growth so that the growth surface shape of the growing crystal is roughly convex in the growth direction, the temperature around the seed crystal inevitably becomes higher than that in the case of small diameter crystal growth. As a result, there was a problem that the SiC single crystal of the seed crystal itself was easily pyrolyzed at the periphery on the outer side. For this problem, Patent Literature 1 solved the problem by using a seed crystal composed of a silicon carbide single crystal with a thickness of 2.0 mm or more as the main solution.

In the present disclosure, in order to fabricate an n-type SiC single crystal ingot with 8-inch diameter, we have succeeded in fabricating an n-type SiC single crystal ingot with 8-inch diameter having characteristics comparable to those of an n-type SiC single-crystal ingot with 6-inch diameter by controlling not only the temperature gradient in the radial direction but also the temperature gradient in the vertical direction (the crystal growth direction) using a heat insulating member that can move along the extending direction of the guide member on the outside of the guide member to guide the crystal growth, as is not the typical method for fabricating an n-type SiC single crystal ingot with 6-inch diameter as shown in Patent Literature 1. The SiC single crystal manufacturing apparatus and the fabrication process of a SiC single crystal ingot is described below.

Figure 5:
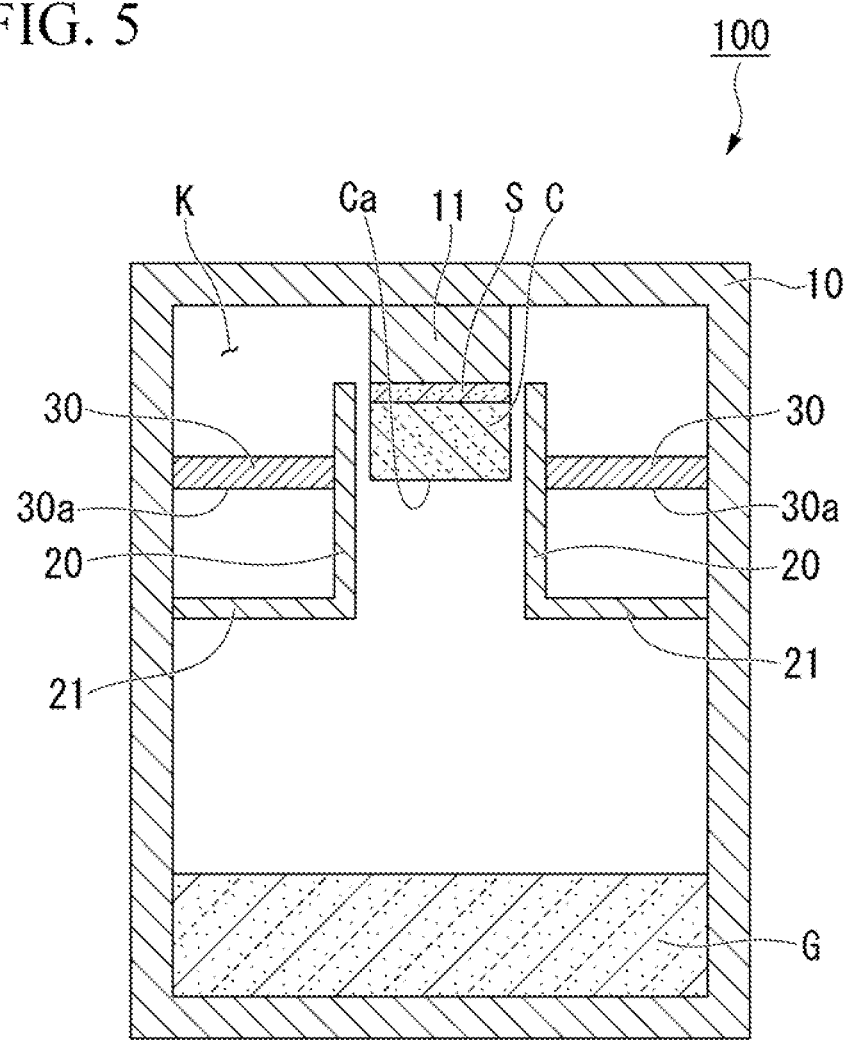
FIG. 5 is a schematic cross-sectional view of a SiC single crystal manufacturing apparatus.

FIG. 5 is a schematic cross-sectional view of an example of a SiC single crystal manufacturing apparatus for carrying out the fabrication process of n-type SiC single crystal ingots.

The SiC single crystal manufacturing apparatus 100 shown in FIG. 5 includes a crucible 10 having a seed crystal installation part 11, a guide member 20, and a heat-insulating member 30, a chamber (not shown) containing these, and a gas introduction pipe (not shown) connected to the chamber and introducing nitrogen gas. In FIG. 5, a raw material G, a seed crystal S, and a single crystal C grown on the seed crystal S are illustrated simultaneously for better understanding.

As shown in the drawings, a direction in which the seed crystal installation part 11 and the raw material G face each other is defined as a vertical direction, and a direction perpendicular to the vertical direction is defined as a left-and-right direction.

The crucible 10 surrounds a film formation space K in which the single crystal C grows. A well-known crucible may serve as the crucible 10 as long as it is a crucible which can produce the single crystal C by a sublimation method. For example, a crucible made of graphite, tantalum carbide or the like can be employed. The crucible 10 is hot during growth, which is necessarily formed of a material tolerable to high temperature. For example, graphite has a very high melting point of 3550° C., and thus is tolerable to the high temperature during growth.

The seed crystal installation part 11 is provided at a position facing the raw material G in the crucible 10. A raw material gas can be efficiently supplied to the seed crystal S and the single crystal C since the seed crystal installation part 11 is located at a position facing the raw material G.

The guide member 20 extends from a periphery of the seed crystal installation part 11 toward the raw material G. That is, the guide member 20 is disposed along a crystal growth direction of the single crystal C. Consequently, the guide member 20 serves as a guide when the single crystal C crystal-grows from the seed crystal S. Crystal growth is carried out on an inner side, that is, on an inner surface side of the guide member 20.

A lower end of the guide member 20 is supported by a support 21. The support 21 closes a space between the lower end of the guide member 20 and the crucible 10 to suppress entry of the raw material gas into a region outside the guide member 20. If the raw material gas intrudes into the region, polycrystals grow between the guide member 20 and the heat-insulating member 30, and the free movement of the heat-insulating member 30 is inhibited.

A connection between the guide member 20 and the support 21 is preferably a caulking structure. The caulking structure is a structure designed to tighten the connection between the guide member 20 and the support 21 in case where physical force is applied to the guide member 20. For example, a screw structure in which the connection is threaded is an example of the caulking structure. The guide member 20 may be in physically contact with the crystal-grown single crystal C, in which the guide member 20 can be prevented from falling off.

Figure 6:
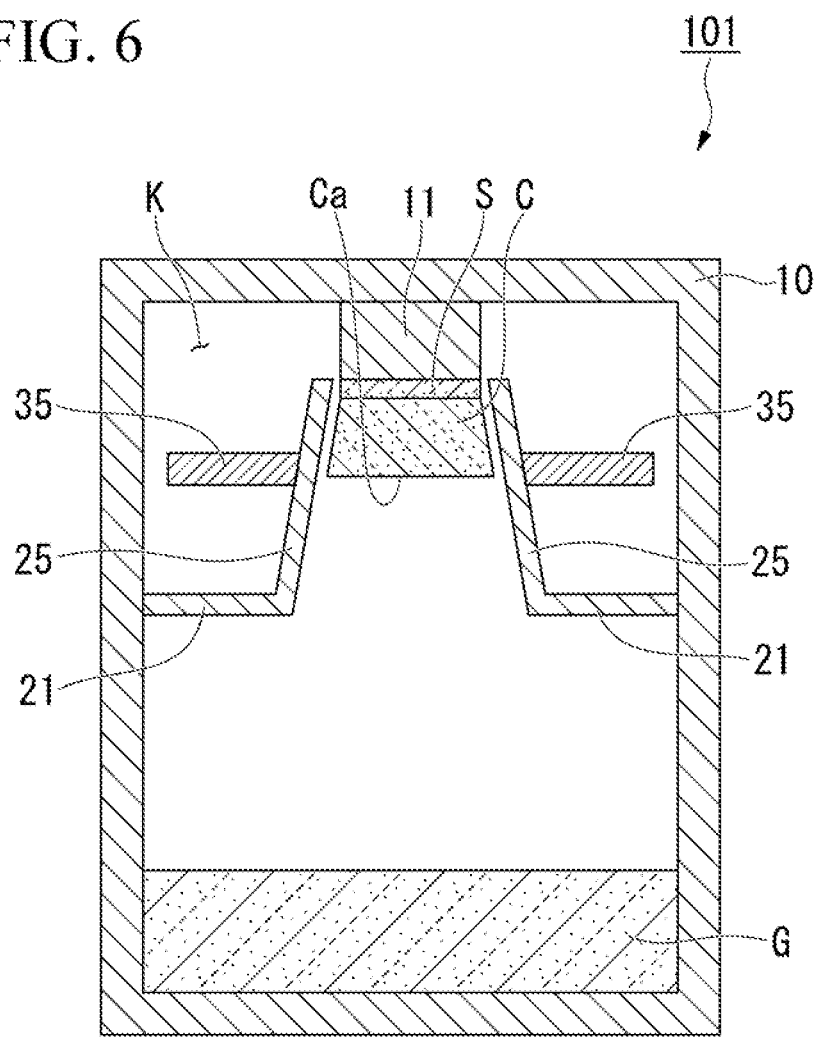
FIG. 6 is a schematic cross-sectional view of another example SiC single crystal manufacturing apparatus.

The guide member 20 in FIG. 5 extends vertically in the vertical direction. The shape of the guide member 20 is not limited to the shape shown in FIG. 5, and examples of the shape includes a tubular shape such as a cylindrical shape, and a truncated cone. A thickness of the guide member may be uniform. A length, an inner diameter and an outer diameter of the member may be optionally selected. FIG. 6 is a schematic cross-sectional view showing another example of the SiC single crystal manufacturing apparatus 101 according to the embodiment. The guide member 25 in FIG. 6 is expanded in diameter toward the raw material G from the seed crystal installation part 11. The diameter of the single crystal C can be increased by expanding the diameter of the guide member 25.

An upper end of the guide member 20 is open in the example shown in FIG. 5. However, the upper end of the guide member 20 may be connected to an inner surface of the crucible 10 to close a space where the heat-insulating member 30 is provided.

A surface of the guide member 20 is preferably coated with tantalum carbide. The guide member 20 is always exposed to the raw material gas to control the flow of the raw material gas. For example, in a case where the guide member 20 is formed of graphite and the guide member 20 is used while graphite is completely exposed, graphite may react with the raw material gas to be deteriorated and get damaged. Deterioration and damage of graphite may cause the guide member 20 to be perforated, and also cause a phenomenon that carbon powder peeled by degradation is taken into the single crystal C and the quality of single crystal C becomes worse. Meanwhile, tantalum carbide can tolerable to high temperature and does not cause an undesirable reaction with the raw material gas. Therefore, high-quality SiC single crystal growth can be stably performed. The guide member 20 may be formed of tantalum carbide only.

The heat-insulating member 30 is movable along an extension direction of the guide member 20 on the outside of the guide member 20. The outside of the guide member 20 may indicate an outer surface side of the guide member. A position of a surface Ca of the single crystal C can move due to growth. The heat-insulating member is moved, whereby it is possible to control a positional relationship between an end surface on a raw material G side of the heat-insulating member 30 (hereinafter referred to as a lower surface 30a) and the surface Ca of the single crystal C. Therefore, a temperature distribution in the vicinity of the surface Ca of the single crystal C can be freely controlled, and a surface shape of the crystal-grown single crystal C can also be freely controlled. In the process of crystal growth, the positional relationship between the end surface 30a on the raw material side of the heat-insulating material 30 and the surface Ca of the single crystal C can be controlled. In addition, the end surface 30a on the raw material side of the heat insulating material 30 can be located within 20 mm from the surface Ca of the single crystal C during the crystal growth process. Further, in the process of crystal growth, the end surface 30a on the raw material side of the heat-insulating material 30 can be located closer to the seed crystal installing portion 11 with respect to the surface Ca of the single crystal C. The thickness of the heat-insulating material 30 can be set to half or less of the growth amount of the SiC single crystal ingot manufactured to be 0.2 mm or more.

Figure 7A:
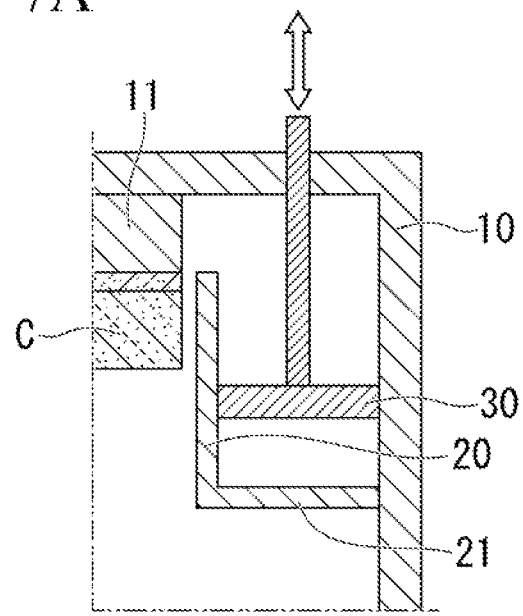
FIG. 7A is a schematic cross-sectional view of the driving means for moving the heat-insulating member up and down in the SiC single crystal manufacturing apparatus.
Figure 7B:
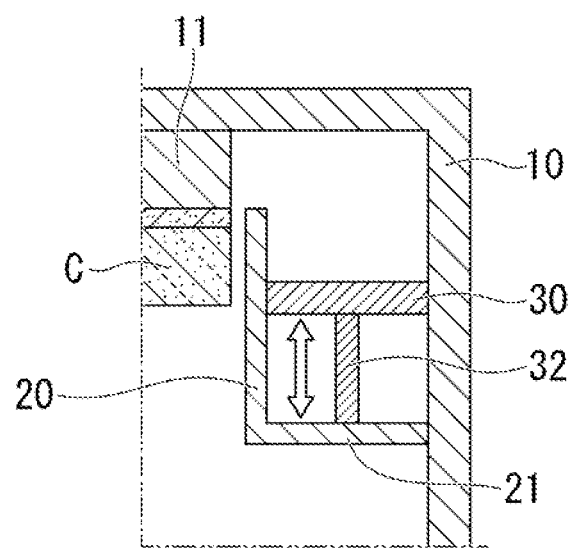
FIG. 7B is a schematic cross-sectional view of the driving means for moving the heat-insulating member up and down in the SiC single crystal manufacturing apparatus.
Figure 7C:
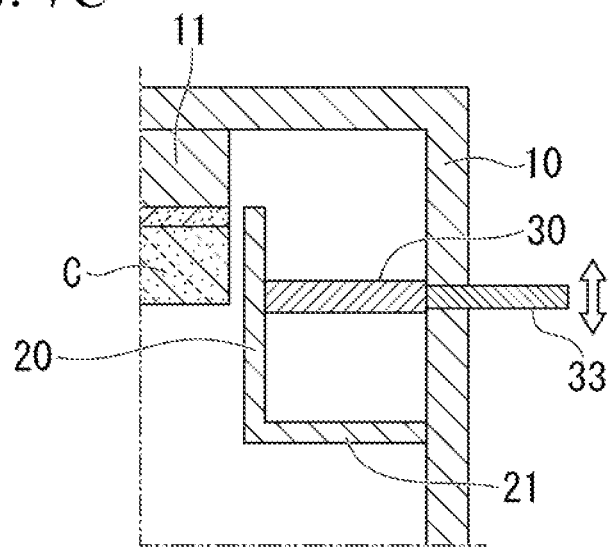
FIG. 7C is a schematic cross-sectional view of the driving means for moving the heat-insulating member up and down in the SiC single crystal manufacturing apparatus.

FIGS. 7A to 7C are schematic cross-sectional views, each showing a preferred example of a driver for moving the heat-insulating member 30 up and down. The driver is not particularly limited as long as the heat-insulating member 30 can be moved in the vertical direction. For example, as shown in FIG. 7A, a driving member 31 extending to the outside of the crucible 10 from an upper portion of the heat-insulating member 30 may be provided to move the heat-insulating member 30 by pushing and pulling the driving member up and down. An upper surface of the crucible 10 may be provided with a notch or an opening for passing the driving member. For example, as shown in FIG. 7B, a lift-type driving member 32 may be provided such that the heat-insulating member 30 may be supported from a lower portion thereof. For example, as shown in FIG. 7C, a notch or opening may be provided in part of a side surface of the crucible 10, and a driving member 33 extending to the outside of the crucible 10 may be provided through the notch or opening to move the heat-insulating member 30 by raising and lowering the driving member.

The heat-insulating member 30 is preferably made of a material having thermal conductivity of 40 W/mk or less at high temperature of 2000° C. or more. Examples of the material having thermal conductivity of 40 W/mk or less at high temperature of 2000° C. or more include a graphite member having thermal conductivity of 120 W/mk or less at normal temperature. Moreover, it is more preferable that the heat-insulating member 30 is formed of a material having thermal conductivity of 5 W/mk or less at high temperature 2000° C. or more. Examples of the material having thermal conductivity of 5 W/mk or less at high temperature 2000° C. or more include a felt material mainly containing graphite and carbon.

The shape of the heat-insulating member 30 is appropriately designed in accordance with a shape of a region sandwiched by the guide member 20 and the inner surface of the crucible 10. The shape of the heat-insulating member can be optionally selected, and may be, for example, donut shaped. As shown in FIG. 5, in a case where a distance between the guide member 20 and the inner surface of the crucible 10 is constant, the heat-insulating member 30 can be arranged to fill in a gap between them. As shown in FIG. 6, in a case where the distance between the guide member 25 and the inner surface of the crucible 10 varies, the shape of the heat-insulating member 30 can be designed in accordance with the position at which the gap between them is the narrowest such that a width of the heat-insulating member 30 is adjusted to be the same as or smaller than a distance at which the gap between them is the narrowest. With such a design, the heat-insulating member 35 is movable, and immovable clogging between the guide member 25 and the inner surface of the crucible 10 can be avoided.

The thickness of the heat-insulating member 30 can be optionally selected, but preferably 0.2 mm or more, more preferably 5 mm or more, still more preferably 20 mm or more. In a case where the heat-insulating member 30 is too thin, a sufficient heat-insulating effect may not be achieved. It is preferable that the thickness of the heat-insulating member 30 is half or less of a length of the single crystal finally manufactured. The length of the single crystal indicates a length in the vertical direction of the single crystal C after crystal growth (the growth amount of the single crystal C). In a case where the growth amount of the single crystal is 100 mm, the thickness of the heat-insulating member 30 is preferably 50 mm or less. In a case where the growth amount of the single crystal is 50 mm, the thickness of the heat-insulating member 30 is preferably 25 mm or less. In a case where the thickness of the heat-insulating member 30 is too thick, the movement of the heat-insulating member 30 is inhibited. If the thickness of the heat-insulating member 30 falls within the range described above, a temperature difference can be formed in the vertical direction within the single crystal C via the heat-insulating member 30. Consequently, it is possible to prevent the raw material gas from being recrystallized in a portion other than the surface Ca of the single crystal C.

As described above, according to the above-described SiC single crystal manufacturing apparatus, the position of the heat-insulating member can be controlled relatively to the crystal-grown single crystal. It is possible to freely control the temperature distribution in the vicinity of the surface of the single crystal C during crystal growth by controlling the position of the heat-insulating member. Since the single crystal C grows along an isothermal surface, controlling the temperature distribution in the vicinity of the surface of the single crystal C leads to controlling the shape of the single crystal C.

A growth method of an n-type SiC single crystal uses the SiC single crystal manufacturing apparatus stated above. Hereinafter, a case where the SiC single crystal manufacturing apparatus 100 as shown in FIG. 5 is employed will be described as an example.

In the n-type SiC single crystal ingot manufacturing process, the single crystal C is grown from the seed crystal S placed in the seed crystal installation part 11. The n-type single crystal C is grown by recrystallization of the raw material sublimated from the material G on the surface of the seed crystal S while introducing nitrogen gas. Nitrogen gas reacts at the crystal surface at a high temperature, doping nitrogen atoms into the SiC single crystal. The nitrogen dopant concentration depends on the nitrogen gas concentration, and the higher the nitrogen gas concentration, the higher the dopant concentration. The obtained SiC single crystal expresses conductivity (resistivity) according to this dopant concentration. The raw material G is sublimated by heating the crucible 10 with a heater provided outside. The sublimed raw material gas is supplied to the seed crystal S along the guide member 20.

In the growth method of the SiC single crystal according to the present embodiment, the positional relationship between the lower surface 30a of the heat-insulating member 30 and the surface Ca of the single crystal C is controlled in a process of performing crystal growth of the single crystal C from the seed crystal S. The shape of the surface Ca of the single crystal C can be freely controlled by controlling such a positional relationship.

Figure 8A:
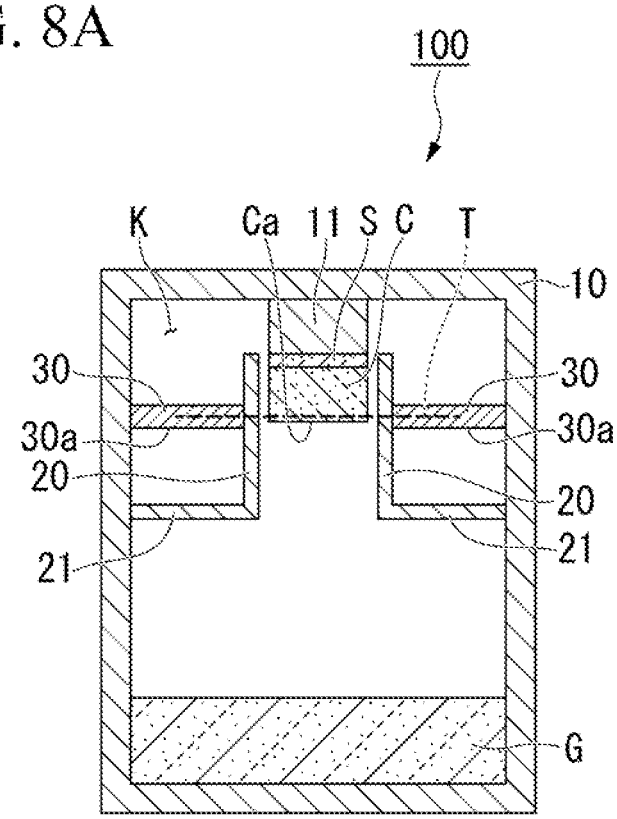
FIG. 8A is the positional relationship between the bottom surface of the heat-insulating member and the surface of the single crystal, and the relationship between the positional relationship and the isothermal surface in the vicinity of the single crystal.
Figure 8B:
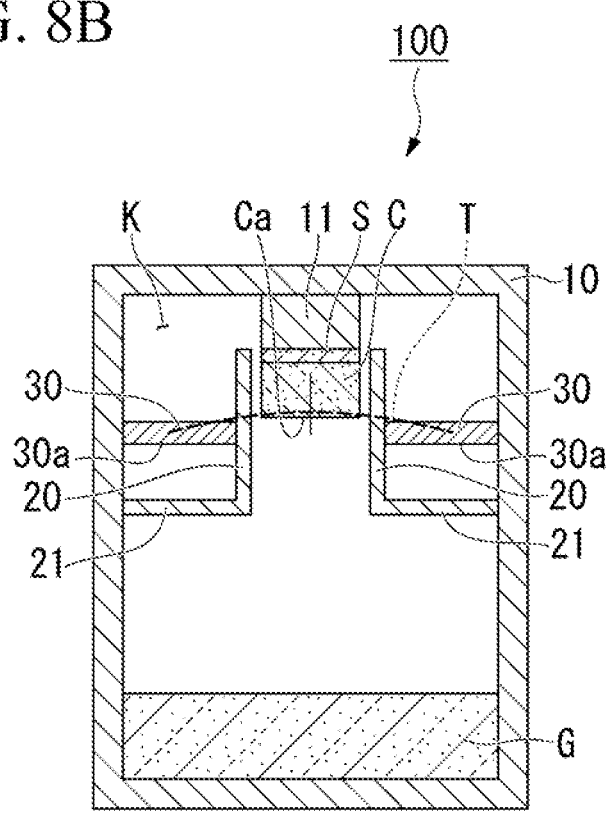
FIG. 8B is the positional relationship between the bottom surface of the heat-insulating member and the surface of the single crystal, and the relationship between the positional relationship and the isothermal surface in the vicinity of the single crystal.
Figure 8C:
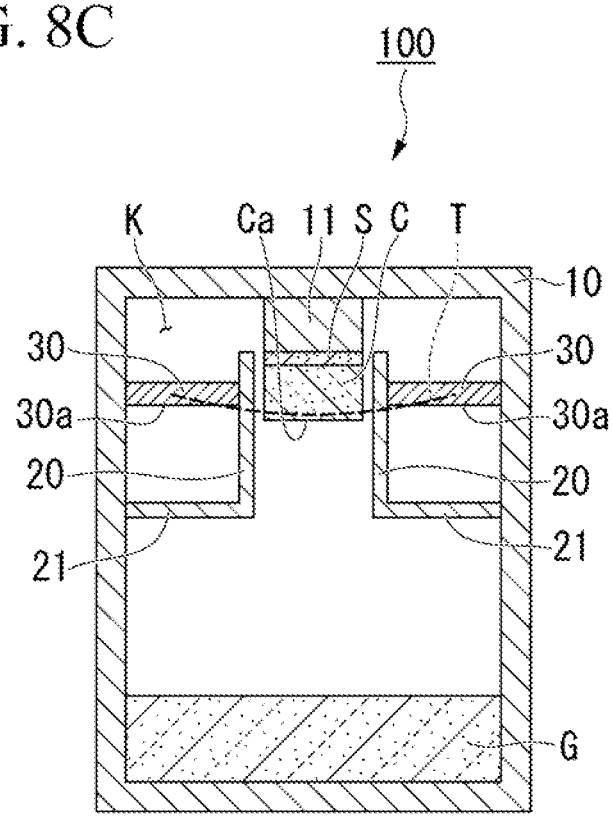
FIG. 8C is the positional relationship between the bottom surface of the heat-insulating member and the surface of the single crystal, and the relationship between the positional relationship and the isothermal surface in the vicinity of the single crystal.

FIGS. 8A-8C show the positional relationship between the lower surface 30a of the heat-insulating member 30 and the surface Ca of the single crystal C, and the relationship between the positional relationship and the isothermal surface in the vicinity of the single crystal C. FIG. 8A is an example in a case where the surface Ca (crystal growth surface) of the single crystal C is flat. FIG. 8B is an example in a case where the surface Ca (crystal growth surface) of the single crystal C is concave. FIG. 8C is an example in a case where the surface Ca (crystal growth surface) of the single crystal C is convex.

As shown in FIGS. 8A to 8C, the shape of the surface Ca of the single crystal C varies depending on the position of the heat-insulating member 30 with respect to the surface Ca of the single crystal C. As shown in FIG. 8A, in a case where the position of the surface Ca of the single crystal C and the position of the lower surface 30a of the heat-insulating member 30 are substantially the same, the surface Ca of the single crystal C is flat. As shown to FIG. 8B, in a case where the lower surface 30a of the heat-insulating member 30 is disposed closer to the raw material G side than the surface Ca of the single crystal C, the surface Ca of the single crystal C is concave. As shown in FIG. 8C, in a case where the surface Ca of the single crystal C is disposed closer to the raw material G than the lower surface 30a of the heat-insulating member 30, the surface Ca of the single crystal C is convex. That is, a convex shape is formed downward. A dotted line in the drawing indicates the isothermal surface T.

Figure 9A:
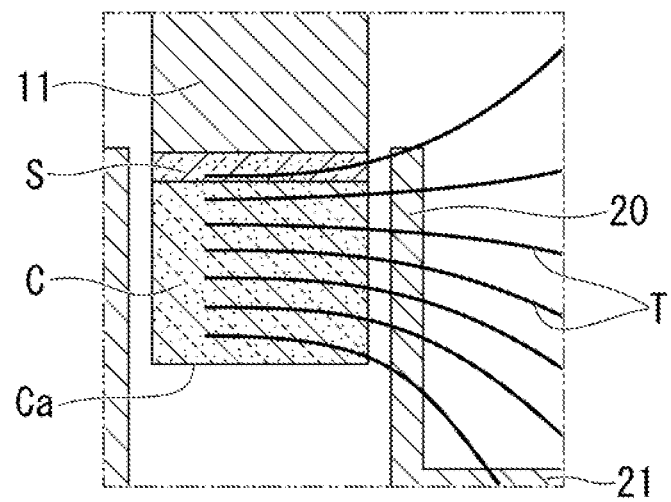
FIG. 9A is a schematic diagram illustrating the shape of the isothermal surface near a single crystal during crystal growth.
Figure 9B:
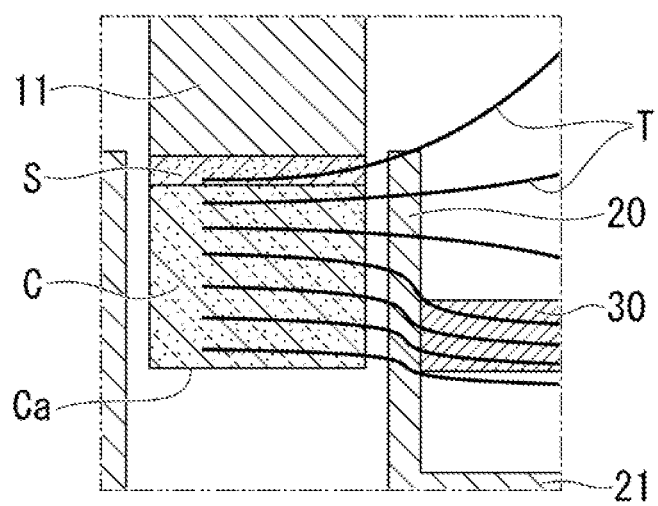
FIG. 9B is a schematic diagram illustrating the shape of the isothermal surface near a single crystal during crystal growth.

The shape of the surface Ca of the single crystal C varies depending on the position of the heat-insulating member 30 with respect to the surface Ca of the single crystal C because the shape of the isothermal surface T varies in the film formation space K. FIGS. 9A and 9B are diagrams schematically showing the shape of the isothermal surface T in the vicinity of the single crystal C during crystal growth. FIG. 9A is a view in a case where the heat-insulating member 30 is not provided. FIG. 9B is a view in a case where the heat-insulating member 30 is provided.

The single crystal C of SiC has a thermal insulation effect due to its low thermal conductivity. Meanwhile, the guide member 20 has higher thermal conductivity than that of the single crystal C. Consequently, as shown in FIG. 9A, the isothermal surface T in a case where the heat-insulating member 30 is not provided is formed so as to expand from the single crystal C. The crystal growth surface of the single crystal C grows along the isothermal surface T. Therefore, in a case where the heat-insulating member 30 is not provided, the shape of the surface Ca (crystal growth surface) of the single crystal C is fixed in a concave shape.

On the other hand, in a case where the heat-insulating member 30 is provided as shown in FIG. 9B, the shape of the isothermal surface T varies. The shape of the isothermal surface T can be freely designed by controlling the position of the heat-insulating member 30 with respect to the single crystal C. Controlling the position may correspond to moving the position in at least one of a lateral direction, a longitudinal direction, and an oblique direction. Designing the shape of the isothermal surface T can be carried out with high accuracy by confirming the shape in advance by simulation or the like. Thus the shape of the surface Ca of the single crystal C can be freely designed by controlling the position of the heat-insulating member 30 with respect to the single crystal C.

In addition, controlling the position of the heat-insulating member 30 with respect to the single crystal C provides the advantageous effects of suppressing adhesion of polycrystals to the guide member 20 and of reducing the temperature difference in an in-plane direction in the single crystal C.

Polycrystals are formed in a low temperature portion in the vicinity of the crystal growth surface of single crystal C. For example, as shown in FIG. 9A, in a case where the temperature difference between the single crystal C and the guide member 20 is large, polycrystals grow on the guide member 20. If the polycrystals grown on the guide member 20 comes in contact with the single crystal C, the crystallinity of the single crystal C is disturbed to cause defects. On the other hand, as shown in FIG. 9B, in a case where the heat-insulating member 30 is in the vicinity of the surface Ca of the single crystal C, the temperature difference between the single crystal C and the guide member 20 can be reduced, thereby suppressing growth of polycrystals.

Additionally, if the temperature difference in the in-plane direction in the single crystal C is large, stress occurs in the process of growing the single crystal C. The stress occurred in the single crystal C produces distortion, deviation or the like, in a crystal plane. Distortion in the single crystal C or the deviation of a lattice plane may cause killer defects such as basal plane dislocation (BPD).

The detailed description has been described that the shape of the surface Ca (lower main surface) of the single crystal C can be controlled. The shape of the surface Ca of the single crystal C is preferably flat or convex toward the raw material G, because if the shape of the surface Ca of the single crystal C is concave toward the raw material G, the quality is inferior. Adjusting the shape of the surface Ca of the single crystal C to be flat or convex, the positions of the surface Ca of the single crystal C and the lower surface 30a of the heat-insulating member 30 are substantially the same, or alternatively, the surface Ca of the single crystal C is disposed closer to the raw material G than the lower surface 30a of the heat-insulating member 30.

The term "substantially the same" does not mean that the positions of the surface Ca of the single crystal C and the lower surface 30a of the heat-insulating member 30 must be completely at the same height; it means that slight misalignment is allowed to the extent which the isothermal surface T is not greatly affected. In particular, if the lower surface 30a of the heat-insulating member 30 is disposed within 30 mm from the surface Ca of the single crystal C, the surface Ca of the single crystal C and the lower surface 30a of the heat-insulating member 30 have the positional relationship that they are substantially the same. In order to adjust the shape of the surface Ca of the single crystal C to be flat, it is preferable that the surface Ca of the single crystal C and the lower surface 30a of the heat-insulating member 30 has the positional relationship that they are nearly identical. It is also preferable that the lower surface 30a of the heat-insulating member 30 is disposed within 20 mm from the surface Ca of the single crystal C, more preferable that the lower surface 30a of the heat-insulating member 30 is disposed within 10 mm.

The surface Ca of the single crystal C is preferably disposed closer to the raw material G than the lower surface 30a of the heat-insulating member 30. That is, it is preferable that the lower surface 30a of the heat-insulating member 30 is disposed closer to the seed crystal installation part 11 than the surface Ca of the single crystal C. Accordingly, even when an external factor such as a temperature fluctuation in the film forming space K occurs, the concave shape of the surface Ca of the single crystal C can be prevented.

It is preferable to control the position of the heat-insulating member 30 from the start of crystal growth. That is, it is preferable to control the positional relationship between the lower surface 30a of the heat-insulating member 30 and the surface of the seed crystal S at the start of crystal growth.

Immediately after the start of crystal growth, the seed crystal installation part 11 is provided around the seed crystal S, and a distance between the seed crystal S and the crucible 10 is also close. Therefore, the isothermal surface T in the film formation space K is also influenced by temperature (thermal conductivity) of these members. That is, the effect exerted by using the heat-insulating member 30 is the strongest in a region where the single crystal C has grown 30 mm or more from the seed crystal S. However, it does not mean that the heat-insulating member 30 does not provide any advantageous effect immediately after the start of crystal growth.

For example, in a case where the shape of the crystal growth surface of single crystal C immediately after crystal growth is concave without providing the heat-insulating member 30, it is necessary to return the shape of the crystal growth surface of the single crystal C to a convex shape in the subsequent growth process. If the shape of the crystal growth surface changes from concave to convex in the growth process, stress is accumulated in the single crystal C, and defects are likely to occur. Therefore, the position of the heat-insulating member 30 is preferably controlled from the start of crystal growth. The positional relationship of the heat-insulating member 30 to the seed crystal S can be designed in the same manner as the positional relationship between the heat-insulating member 30 and the single crystal C in the process of crystal growth.

Fabrication Process of SiC Single Crystal Substrate

The process of fabricating a SiC single crystal substrate from the obtained n-type SiC single crystal ingot includes a flattening process involving lapping using a predetermined polishing slurry and a process of removing a work-affected layer. In the fabrication of a SiC single crystal substrate, lapping can be performed using a slurry characteristic of lapping. Other than that, known methods can be used for processing from SiC single crystal ingots to obtaining SiC single crystal substrates. The lapping process is described below.

Next, the available lapping slurries are detailed.

In the processing process of the free abrasive grain method, slurry containing, for example, water, boron carbide abrasive grains, and an additive for dispersing the boron carbide abrasive grains is supplied between the upper and lower surface plates, and pressure is applied to the SiC substrate 1 by the upper surface plate 21 and the lower surface plate to flatten the surface of the SiC substrate 1. The slurry used in the processing process is a slurry containing, for example, water as the main component. When a slurry containing water as the main component is used, the dispersibility of the boron carbide abrasive grains is enhanced and secondary aggregation is less likely to occur in the processing process. When a slurry containing water as a main component is used, the surface of the SiC substrate on the upper surface plate side where the slurry feed hole is provided is cleaned by the direct supply of water, and the surface of the SiC substrate on the lower surface plate side where the slurry feed hole is not provided is cleaned by the water supplied through the gap between the SiC substrate and the carrier plate. The slurry used in the lapping process is collected in a tank and fed again from the tank.

The modified Mohs hardness (14) of the boron carbide abrasive grain is slightly larger than the modified Mohs hardness (13) of the SiC substrate as an object to be polished and smaller than the modified Mohs hardness (15) of the diamond. Therefore, by using such a slurry, the processing speed can be relatively increased while the generation of cracks on the SiC substrate having the modified Mohs hardness (13) is suppressed, and the decrease in the grain size of the boron carbide abrasive grain can be suppressed.

The ratio of boron carbide abrasive grains in the slurry is, for example, 15 mass % or more and 45 mass % or less, preferably 20 mass % or more and 40 mass % or less, and more preferably 25 mass % or more and 35 mass % or less. When the ratio of the boron carbide abrasive grains in the slurry is 15 mass % or more, the content of the boron carbide abrasive grains in the slurry can be increased and the processing speed of the lapping process can be enhanced. In addition, when the ratio of the boron carbide abrasive grains in the slurry is 45 mass % or less, the frequency and area of contact between the boron carbide abrasive grains can be suppressed, and it is easy to suppress the decrease in the grain size of the boron carbide abrasive grains and the abrasion of the boron carbide abrasive grains.

The boron carbide abrasive grain in the slurry used in the processing process has an average grain size of, for example, 15 μm or more and 40 μm or less is preferably 25 μm or more and 35 μm or less. By using boron carbide abrasive grains with an average grain size of 15 μm or more, it is easy to increase the processing speed for lapping the surface of the SiC substrate 1, and furthermore, it is possible to attach sufficient additives to the surface, which leads to improvement in dispersibility and suppression of decrease in grain size. In addition, by making the average grain size less than 40 μm, it is easy to obtain the effect of suppressing cracks or fissures in the SiC substrate, and furthermore, it is possible to suppress the excessive adhesion of additives described later to the surface and to suppress the decrease in the processing speed due to the decrease in the contact area with the SiC substrate as a workpiece. In addition, by using such boron carbide abrasive grains, it is easy to suppress the change in particle size before and after lapping. Here, the average grain size of the above boron carbide abrasive grain is the average grain size of the boron carbide abrasive grain before processing, and the average grain size of the boron carbide abrasive grain after processing is, for example, 14 μm or more and 48 μm or less, and preferably 23 μm or more and 42 μm or less, because the ratio of the average grain size of the boron carbide abrasive grain before and after processing is 0.91 to 1.2.

Here, the average grain size of the boron carbide abrasive grain is measured based on the particle size distribution measured by laser scattering light measurement using a particle size distribution measuring device Mastersizer Hydro 2000 MU (Spectris Co., Ltd.) or MT 3000 Type II (Microtrack Bell Co., Ltd.).

As an additive, polyalcohols, esters and their salts, homopolymers and their salts, copolymers and the like can be used. Specific examples include one or more substances selected from the group consisting of glycerin, 1-vinylimidazole, sodium palm oil fatty acid methyl taurine, sodium laurate amide ether sulfate, sodium myristate amide ether sulfate, polyacrylic acid and acrylic acid-maleic acid copolymers.

These additives are thought to enhance the dispersibility of boron carbide abrasive grains in the slurry.

The additive adheres to the surface of the boron carbide abrasive grain and inhibits direct contact between the boron carbide abrasive grains. In this way, the additive enhances the dispersibility of the boron carbide abrasive grains in the slurry and suppresses the grain size reduction of the abrasive grains in the processing process.

The percentage of the additive in the slurry is, for example, 3 volume % or more and 20 volume % or less, preferably 5 volume % or more and 15 volume % or less, and preferably 10 volume % or more and 15 volume % or less. Here, the ratio of additive in the slurry refers to the ratio of the volume of additive (additive components) such as glycerin divided by the volume of the slurry. When the additive in the slurry is within the above range, it adheres to the surface of the boron carbide in the slurry in a necessary and sufficient manner to obtain a favorable degree of dispersion of the boron carbide abrasive grain in the slurry, and it is easy to suppress the decrease in the grain size of the boron carbide abrasive grain in the processing process.

In this lapping process, the processing speed for processing the surface of the SiC substrate in the processing process is, for example, 14 μm/h or more and 45 μm/h or less, preferably from 16 μm/h or more and 40 μm/h or less, and more preferably from 18 μm/h or more and 25 μm/h or less. The processing speed depends on the processing pressure described above and the average grain size of the boron carbide abrasive grains. It is easy to obtain the effect of reducing the grain size of the boron carbide abrasive grain and suppressing the abrasion of the boron carbide abrasive grain by setting the processing speed to 45 μm/h or less. The throughput can be increased by increasing the processing speed to 14 μm/h or more. When lapping processing is performed in multiple batches, the processing speed obtained by dividing the total change in the thickness of the SiC substrate by the total processing time may be within the above range, and it is preferable that the processing speed at any timing is within the above range. That is, when lapping is performed in multiple batches, it is preferable that the processing speed calculated in each batch is within the above range.

Here, the processing speed is calculated from the difference in the thickness of the SiC substrate 1 before and after lapping and the processing time. Specifically, the processing speed is calculated by the following method. The measurement positions of the thickness of the SiC substrate 1 are position 1c corresponding to the center of the SiC substrate before the formation of the orientation flat OF on the SiC substrate 1, position 1a being 5 mm to 10 mm away from the midpoint of the orientation flat OF toward the position 1c, position 1b on the same straight line c as positions 1a and 1c and being 5 mm to 10 mm away in the direction of position 1a from the outer periphery of the SiC substrate 1, and positions 1d and 1e on the straight line perpendicular to the straight line c and being 5 mm to 10 mm away in the direction of position 1a from the outer periphery of the SiC substrate 1. The thickness of SiC substrate 1 at these five positions 1a to 1e is measured by an indicator (ID-C 150 XB, made by Mitsutoyo), and the obtained thickness is treated as the thickness of SiC substrate 1. The processing speed is calculated by dividing the difference in the thickness (micrometers) of the SiC substrate 1 before and after the processing thus obtained by the processing time (h).

Adhesion of additives to the surface of the boron carbide abrasive grains in the slurry used in the processing process increases the dispersibility of the boron carbide abrasive grains, and the contact of the boron carbide abrasive grains can be suppressed, so that the decrease in the grain size of the boron carbide abrasive grains can be suppressed.

Specifically, the change in the grain size of the boron carbide abrasive grain can be suppressed to the extent that the ratio of the average grain size of the boron carbide abrasive grain after processing to the average grain size of the boron carbide abrasive grain before processing is 0.91 to 1.2 in the processing process. The reason why the ratio includes a value greater than 1 is that, in the processing process, boron carbide abrasive grains are secondarily agglomerated, and the grain size of some boron carbide abrasive grains may be larger than that before processing.

In the conventional lapping process, since the grain size of the boron carbide abrasive grain in the slurry is greatly reduced by lapping process, it is necessary to add abrasive grain to the slurry each time the lapping process is performed again, and each time it is necessary to carry out complicated management to obtain the distribution of the grain size of the abrasive grain in the slurry depending on the number of batches used for lapping process.

In this way, this lapping process facilitates the management of the grain size of the boron carbide abrasive grain and reduces the cost, in addition to reducing the environmental load and suppressing the occurrence of cracks.

In addition, since the grain size of the boron carbide abrasive grains does not change much in this lapping process, the change in the processing speed during lapping process can be restrained and the lapping process can be continued under the same conditions. This lapping process is particularly effective when using boron carbide, which has a slightly higher modified Mohs hardness than silicon carbide as an object to be polished. Because such abrasive grains and substrates are used in this lapping process, it is also possible to suppress cracks that occur frequently when diamond is used as abrasive grains and SiC substrates are used as objects to be polished.

In addition, since this lapping process can suppress the decrease in the grain size and abrasion of the boron carbide abrasive grain, the dispersion of the grain size of the boron carbide abrasive grain in the slurry during lapping process is reduced. While the processing speed of the lapping process depends on the grain size of the abrasive grain used, in this lapping process, since the variation in the grain size of the abrasive grain can be suppressed, the whole surface of the SiC substrate is processed by the abrasive grain of approximately equal grain size, and the in-plane variation of the substrate thickness of the SiC substrate after processing is reduced.

EXAMPLES

Examples of the disclosure are described below, but the disclosure is not limited to the following examples.

Example 1

First, an n-type SiC single-crystal ingot was fabricated using the SiC single crystal manufacturing apparatus shown in FIG. 5.

A 4H—SiC single crystal having a surface with an off angle of 4° with respect to the (0001) plane, as a main surface, a diameter of 200 mm and a thickness of 5.0 mm was used as the seed crystal S. In the early stage of crystal growth, the crucible temperature was controlled so that the temperature (Tr) in the vicinity of the same height as the seed crystal surface on the side wall of the crucible body was 30° C. to 150° C., the temperature (Tg) in the center of the seed crystal in the plan view of the outer wall of the crucible lid was 50° C. to 250° C., and the temperature difference ($\Delta T$) between Tr and Tg was 20° C. to 100° C. In accordance with the crystal growth, the crystal growth was carried out while gradually moving the heat-insulating member 30 so that the end face (lower surface 30a in FIG. 8C) of the raw material side of the heat-insulating member 30 was closer to the lid than the growth surface of the single crystal and the distance in the growth direction between the end face of the raw material side of the heat-insulating member 30 and the growth surface of the single crystal was within 10 mm Nitrogen gas was introduced for 45 minutes at a partial pressure of 554 Pa at 1 hour after the start of crystal growth.

The n-type SiC single crystal ingot thus obtained was 208 mm in diameter and 20.2 mm in height.

Then, an n-type SiC single crystal substrate having an off angle of 4° with respect to the (0001) plane and a thickness of 0.9 mm was obtained by a known processing method.

The thickness of the SiC single crystal substrate was measured.

Then, the SiC single crystal substrate whose thickness was measured was placed on the carrier plate of the polishing device and lapped. The lapping slurry was obtained by adding a predetermined amount of boron carbide abrasive grains and AD8 (10 vol %) as an additive to water and dispersing. The grain size F 320 (JIS R 6001) was used as the boron carbide abrasive grain. Here, the proportion of glycerin (made by Aichemitechno Co., Ltd.) as an additive in the slurry was set at 6 vol %.

The lapping process was performed by the free abrasive grain method while the lapping slurry was supplied at a rate of 16 L/min. The lapping slurry was cycled and used.

The driving conditions of the polishing device in the lapping process were as follows: processing pressure 160 g/cm$^2$, lower surface speed 16 rpm, upper surface speed 5.5 rpm, center gear speed 2.8 rpm, internal gear speed 6.0 rpm, and processing time 40 minutes.

After lapping, the particle size distribution of the boron carbide abrasive grains in the slurry was measured in the same manner as before lapping, and the thickness of the substrate was measured in the same manner as before lapping, and the processing speed was calculated. In this lapping process, the average processing speed of 15 SiC substrates was 18 nm/h.

After the measurements were made, the slurry used in the previous lapping process was fed and a second lapping process and measurements were performed while circulating the slurry. In Example 1, this was repeated and a total of eight lapping and measurements were performed.

Then, an etching process for removing the work-affected layer and a CMP process for mirror-polishing were performed to obtain the SiC single crystal substrate of Example 1.

Example 2

A SiC single crystal substrate was obtained under the same conditions as in Example 1 in the preparation of the SiC single crystal ingot, except that the temperature at the highest temperature point of the raw material was raised by 20° C., the driving conditions of the polishing apparatus in the lapping process were adjusted so that the in-plane variation in substrate thickness after lapping was smaller than in Example 1, and the amount of nitrogen gas introduced was changed.

Comparative Example 1

A SiC single crystal substrate was obtained under the same conditions as in Example 1, except that using a SiC single crystal manufacturing apparatus without a heat-insulating material 30, using a seed crystal S with a diameter of 150 mm, Tr, Tg, and $\Delta T$ were not controlled during the crystal growth, and lapping slurry containing no additive (AD8) was used in the lapping process, and the introduction amount of nitrogen gas was changed.

Comparative Example 2

A SiC single crystal substrate was obtained under the same conditions as in Comparative Example 1 except that the temperature of the highest temperature point of the raw material was changed to increase by 10° C. and the amount of nitrogen gas introduced was changed.

Comparative Example 3

A SiC single crystal ingot was prepared using a SiC single crystal manufacturing apparatus without heat-insulating member 30, and a SiC single crystal substrate was obtained under the same conditions as in Example 1 except that lapping slurry containing no additive (AD8) was used in the lapping process and the amount of nitrogen gas introduced was changed.

Evaluation

For the SiC single crystal substrates of Example 1, Example 2, and Comparative Example 1 to Comparative Example 3, the concentration of nitrogen being a dopant at a given point was measured using SIMS in the thickness direction from the laminate surface. Table 1 shows the results. The five points where the nitrogen concentrations shown in Table 1 were obtained are the center point O in the plane with a depth of 3 μm, the point p1 with 1.0 mm from the outer periphery, and three points (p2, p3, p4) obtained by dividing the distance between them into quarters (see FIGS. 1A and 1B).

Figure 10:
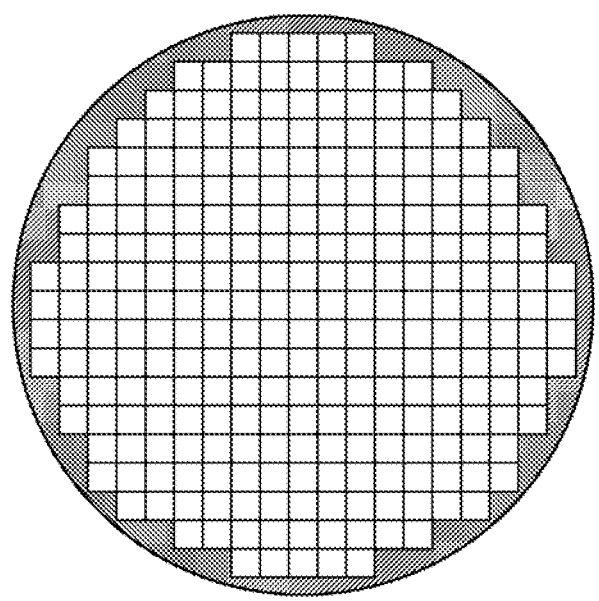
FIG. 10 is a plan diagram showing an example of a 10 mm square mesh.

In addition, the in-plane average nitrogen concentration in Table 1 is the average nitrogen concentration at those five points, and the nitrogen concentration distribution of five points indicates the percentage of the difference in nitrogen concentration between the nitrogen concentration at the center and the nitrogen concentration at the point having the largest difference from the nitrogen concentration at the center among the other four points. Also, the percentage (%) of the predetermined number of meshes in Table 1 is the percentage of meshes in which the dopant concentration at the center point in each mesh is within +/−20% of the dopant concentration of mesh $M_O$ including the in-plane center, when the substrate is divided into 10 mm square meshes. FIG. 10 schematically shows how the mesh is divided into 10 mm squares. FIG. 10 is an example of, but not limited to, how to divide 10 mm square meshes.

dopant concentration of mesh $M_O$ containing the in-plane center is larger in Example 1 and Example 2 than in Comparative Example 1 to Comparative Example 3. In this way, Example 1 and Example 2 have a better in-plane nitrogen concentration distribution than Comparative Example 1 to Comparative Example 3. These results are considered to be the effect of higher quality SiC single crystals obtained by more precise temperature control in Example 1 and Example 2 compared to Comparative Example 1 to Comparative Example 3.

In addition, SORI, in-plane variation in substrate thickness, a number of micropipes, a total number of dislocations, threading dislocation density, and basal dislocation density were evaluated for n-type SiC single crystal substrates in Example 1, Example 2, Comparative Example 1, Comparative Example 2, and Comparative Example 3. The number of micropipes, the total number of dislocations, the threading dislocation density, and the basal dislocation density were evaluated by the etch pits revealed by KOH etching at 550° C. for 10 min. Table 2 shows the results. The TD etch pit densities in Table 2 are the combined TSD and TED etch pit densities.

TABLE 2

| | heat-insulating member | total number of etch pits[pcs] | density of TD etch pits [pcs/cm$^2$] | density of BPD etch pits [pcs/cm$^2$] | SORI [μm] | in-plane thickness distribution after lapping[μm] | in-plane thickness distribution [μm] |
|---|---|---|---|---|---|---|---|
| Example 1 | ○ | 1.2 × 10$^6$ | 400 | 310 | 21 | 1.2 | 1.3 |
| Example 2 | ○ | 2.1 × 10$^6$ | 450 | 500 | 14 | 0.9 | 0.9 |
| Comparative Ex1 | X | 5.6 × 10$^6$ | 1500 | 2400 | 30 | 2.2 | 2.4 |
| Comparative Ex2 | X | 6.6 × 10$^6$ | 2300 | 3600 | 28 | 2.6 | 2.5 |
| Comparative Ex3 | X | 5.1 × 10$^7$ | 1900 | 4300 | 45 | 2.8 | 2.9 |

The densities of micropipe defects were 1/cm$^2$ or less in both Example 1, Example 2 and Comparative Example 1 to Comparative Example 3.

Both SORI and substrate thickness were significantly reduced in Examples 1 and Example 2 compared to Comparative Example 1 to Comparative Example 3.

In addition, Example 1 and Example 2 (8-inch substrates) were more than comparable to Comparative Examples 1 and 2 (6-inch substrates), the total number of etch pits was sufficiently reduced, and both TD and BPD etch pit densities were significantly reduced. This result is considered to be the effect of more precise temperature control in Example 1 and Example 2.

TABLE 1

| | heat-insulating member | in-plane average N concentration [/cm$^3$] | nitrogen concentration at each point[/cm$^3$] | | | | | N concentration distribution of 5 points [%] | predetermined meshes[%] |
|---|---|---|---|---|---|---|---|---|---|
| | | | center | p1 | p2 | p3 | p4 | | |
| Example 1 | ○ | 2.3 × 10$^{18}$ | 2.3 × 10$^{18}$ | 2.4 × 10$^{18}$ | 2.2 × 10$^{18}$ | 2.1 × 10$^{18}$ | 2.4 × 10$^{18}$ | 9% | 87.3 |
| Example 2 | ○ | 5.5 × 10$^{19}$ | 5.7 × 10$^{19}$ | 5.2 × 10$^{19}$ | 5.1 × 10$^{19}$ | 5.3 × 10$^{19}$ | 6.0 × 10$^{19}$ | 11% | 94.8 |
| Comparative Ex1 | X | 1.1 × 10$^{18}$ | 1.0 × 10$^{18}$ | 8.9 × 10$^{17}$ | 1.1 × 10$^{18}$ | 1.0 × 10$^{18}$ | 1.3 × 10$^{18}$ | 30% | 76.5 |
| Comparative Ex2 | X | 6.1 × 10$^{19}$ | 6.2 × 10$^{19}$ | 5.3 × 10$^{19}$ | 5.2 × 10$^{19}$ | 6.6 × 10$^{19}$ | 7.0 × 10$^{19}$ | 16% | 79.1 |
| Comparative Ex3 | X | 2.2 × 10$^{18}$ | 2.0 × 10$^{18}$ | 2.5 × 10$^{18}$ | 1.7 × 10$^{18}$ | 2.3 × 10$^{18}$ | 2.7 × 10$^{18}$ | 35% | 60.0 |

Based on the results shown in Table 1, it can be seen that the nitrogen concentration distribution at 5 points is reduced in Example 1 and Example 2 compared to Comparative Example 1 to Comparative Example 3. In addition, it can be seen that the proportion of meshes within +/−20% of the In addition, both the total number of etch pits, the TD etch pit density and the BPD etch pit density were significantly reduced in Examples 1 and 2 (8-inch substrate) compared to Comparative Example 3 (8-inch substrate). From this result, it was found that the influence of more precise temperature control is greater in the production of 8-inch SiC single crystal substrates than in the production of 6-inch SiC single crystal substrates.

EXPLANATION OF REFERENCES

1 SiC single crystal substrate

What is claimed is:

1. An 8-inch n-type SiC single crystal substrate, wherein the diameter is in a range of 195 mm to 205 mm, the thickness is in a range of 300 μm to 650 μm, the thicknesses of work-affected layers on both the front and back surfaces are 0.1 nm or less, and the dopant concentration is $2\times10^{18}/cm^3$ or more and $6\times10^{19}/cm^3$ or less at least five arbitrarily selected points in the plane at the same depth from the main surface within 5% of the thickness of the substrate in the depth direction from the main surface of the substrate.

2. The 8-inch n-type SiC single crystal substrate according to claim 1, wherein the dopant concentration at least five points in the radial direction, including a point within 1 mm from the outermost periphery, are within +/−20%, with respect to the dopant concentration at the in-plane center at the same depth from the main surface.

3. An 8-inch n-type SiC single crystal substrate, wherein the diameter is in a range of 195 mm to 205 mm, the thickness is in a range of 300 μm to 650 μm, the thicknesses of work-affected layers on both the front and back surfaces are 0.1 nm or less, the dopant concentration is $2\times10^{18}/cm^3$ or more and $6\times10^{19}/cm^3$ or less, and when the plane at the same depth from the main surface within 5% of the thickness of the substrate in the depth direction from the main surface of the substrate is divided into 10 mm square meshes and the dopant concentration at any point in each mesh is taken as the dopant concentration of the mesh, the percentage of the mesh whose dopant concentration is within +/−20% of the dopant concentration of the mesh containing the in-plane center is 80% or more.

4. An 8-inch n-type SiC single crystal substrate, wherein the diameter is in a range of 195 mm to 205 mm, the thickness is in a range of 300 μm to 650 μm, the thicknesses of work-affected layers on both the front and back surfaces are 0.1 nm or less, the dopant concentration is $2\times10^{18}/cm^3$ or more and $6\times10^{19}/cm^3$ or less, and the in-plane variation of the thickness of the substrate, which is the difference between the maximum and minimum substrate thickness at the center of the substrate and four points on the circumference of a circle having a radius half the radius of the substrate, is 2.0 μm or less.

5. An 8-inch n-type SiC single crystal substrate according to claim 4, wherein the in-plane variation of the thickness of the substrate is 1.5 μm or less.

6. An 8-inch n-type SiC single crystal substrate according to claim 4, wherein the in-plane variation of the thickness of the substrate is 1.0 μm or less.

7. An 8-inch n-type SiC single crystal substrate according to claim 4, wherein SORI is 21 μm or less.

8. An 8-inch n-type SiC single crystal substrate according to claim 4, wherein the density of micropipe defects is $1/cm^2$ or less, and the total number of etch pits appearing by KOH etching performed at 550° C. for 10 minutes is $2.1\times10^6$ or less.

* * * * *